United States Patent
Kobayashi et al.

(10) Patent No.: US 10,549,423 B2
(45) Date of Patent: Feb. 4, 2020

(54) CONTROLLER AND MACHINE LEARNING DEVICE

(71) Applicant: FANUC Corporation, Yamanashi (JP)

(72) Inventors: Yuuta Kobayashi, Yamanashi (JP); Hideki Otsuki, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 114 days.

(21) Appl. No.: 15/949,572

(22) Filed: Apr. 10, 2018

(65) Prior Publication Data

US 2018/0297199 A1    Oct. 18, 2018

(30) Foreign Application Priority Data

Apr. 13, 2017   (JP) .................................. 2017-079844

(51) Int. Cl.
| | | |
|---|---|---|
| B25J 9/16 | (2006.01) | |
| B25J 11/00 | (2006.01) | |
| H01L 21/48 | (2006.01) | |
| G06N 3/08 | (2006.01) | |
| H01L 23/40 | (2006.01) | |

(52) U.S. Cl.
CPC ............ B25J 9/163 (2013.01); B25J 11/005 (2013.01); H01L 21/4882 (2013.01); G06N 3/08 (2013.01); *H01L 2023/4068* (2013.01); *Y10S 901/03* (2013.01); *Y10S 901/41* (2013.01)

(58) Field of Classification Search
None
See application file for complete search history.

(56) References Cited

U.S. PATENT DOCUMENTS

| | | | |
|---|---|---|---|
| 2014/0196879 A1* | 7/2014 | Cheung ..................... | F28F 7/00 165/185 |
| 2016/0133541 A1 | 5/2016 | Ozawa et al. | |
| 2017/0028562 A1* | 2/2017 | Yamazaki ............. | B25J 9/1612 |
| 2017/0063284 A1 | 3/2017 | Matsumoto et al. | |

FOREIGN PATENT DOCUMENTS

| | | |
|---|---|---|
| EP | 3119176 A1 | 1/2017 |
| JP | H7-335795 A | 12/1995 |
| JP | 8-112788 A | 5/1996 |
| JP | H10-321653 A | 12/1998 |
| JP | 2007-19337 A | 1/2007 |
| JP | 2010-135459 A | 6/2010 |
| JP | 2015-153914 A | 8/2015 |
| JP | 2016-92300 A | 5/2016 |
| JP | 2017-33526 A | 2/2017 |
| JP | 2017-45406 A | 3/2017 |

OTHER PUBLICATIONS

Office Action in JP Application No. 2017-079844, dated Dec. 25, 2018, 6pp.

* cited by examiner

*Primary Examiner* — Sean Shechtman
(74) *Attorney, Agent, or Firm* — Hauptman Ham, LLP

(57) ABSTRACT

A controller includes a machine learning device that learns an operating parameter for an operation of bonding a radiation plate by a robot. The machine learning device observes operating parameter data and heat conductor state data as state variables that express a current state of an environment. In addition, the machine learning device acquires determination data indicating a propriety determination result of the operation of bonding the radiation plate, and learns the operating parameter in association with the heat conductor state data, using the state variables and the determination data.

6 Claims, 6 Drawing Sheets

CONTROLLER AND MACHINE LEARNING DEVICE

RELATED APPLICATIONS

The present application claims priority to Japanese Application Number 2017-079844, filed on Apr. 13, 2017, the disclosure of which is hereby incorporated by reference herein in its entirety.

BACKGROUND OF THE INVENTION

1. Field of the Invention

The present invention relates to a controller and a machine learning device and, in particular, to a controller and a machine learning device that learn optimum operating parameters for bonding a radiation plate to an electronic element by a robot.

2. Description of the Related Art

Conventionally, technologies for using a robot in order to mount an electric component or the like on a substrate have been known (see, for example, Japanese Patent Application Laid-open No. 08-112788). In the mounting of an electric component by a robot, a tool for holding the component is attached at the tip of a robot arm, and the electric component or the like held by the tool is set at a prescribed position on a substrate and then mounted thereon.

Some electric components mounted on a substrate require a radiation plate to be attached thereto. When attaching a radiation plate to an electric component, as illustrated by an example in FIGS. 8A to 8C, a radiation plate 3 is attached to an electric component 5 in such a way that, after the electric component 5 is mounted on a tool 2 attached at the tip of a robot arm 1, the radiation plate 3 coated with a heat conductor such as a silicon adhesive at its surface contacting the electric component 5 is set at a prescribed position above the electric component 5 (FIG. 8A), moved to a bonding position at which the radiation plate 3 is to be bonded to an electronic element at prescribed speed (FIG. 8B), and pressed against the electric component 5 (FIG. 8C).

Here, speed at which the radiation plate 3 is moved to the bonding position at which the radiation plate 3 is to be bonded to the electric component 5 and pressing pressure and pressing time at which the radiation plate 3 is pressed against the electric component 5 have an influence on the area and the film thickness of a heat conductor between the bonded radiation plate 3 and the electric component 5. Conventionally, when a radiation plate is automatically bonded to an electric component by a robot, an operator teaches the robot movement for bonding the radiation plate in advance and performs a bonding operation while managing the film thickness of a heat conductor between the radiation plate and the electric component.

When a robot is caused to automatically bond a radiation plate to an electric component by teaching, an operator performs the teaching so that the operation of the robot is optimized to further shorten tact time. In the state of FIG. 8A, tact time increases when the radiation plate 3 is set at a position away from the electric component 5. On the other hand, the tact time shortens when the radiation plate 3 is set at a position close to the electric component 5, but speed at which the radiation plate 3 is moved to the bonding position may not reach prescribed speed.

Further, when the speed at which the radiation plate 3 is moved to the bonding position is set high in the state of FIG. 8B to shorten the tact time, there is a likelihood that the heat conductor 4 scatters when colliding with the electric component 5 or the electric component 5 is broken due to an impact at the collision.

Moreover, in the state of FIG. 8C, the electric component 5 or the substrate may be broken when the pressure at which the radiation plate is pressed against the electric component 5 is set too high. On the other hand, the radiation plate 3 may not be satisfactorily bonded to the electric component 5 or appropriate film thickness may not be maintained when the pressure at which the radiation plate 3 is pressed against the electric component 5 is set low or when the time at which the radiation plate 3 is pressed against the electric component 5 is shortened.

As described above, the determination of operating parameters for automatically bonding a radiation plate to an electric component leads to tact time or quality of a product. However, appropriate operating parameters change with a type of a heat conductor (relating to viscosity of the heat conductor), a coating amount, temperature, humidity of the heat conductor (having an influence on the viscosity of the heat conductor), a type of a substrate or an electric component (relating to strength of the substrate or the electric component), or the like. Therefore, an operator is required to determine the operating parameters by trial and error. As a result, the determination of the operating parameters puts an enormous load on the operator.

SUMMARY OF THE INVENTION

In view of the above problem, the present invention has an object of providing a controller and a machine learning device capable of determining optimum operating parameters for bonding a radiation plate to an electronic element by a robot.

A controller according to the present invention collects data such as the film thickness of a heat conductor and tact time obtained by performing the operation of bonding a radiation plate to an electric component while randomly changing the operating parameters (a command position, arm speed, pressing pressure, and pressing time) of a robot, and performs machine learning using the collected data as teacher data. As a result, the controller makes it possible to derive operating parameters under which a product with its heat conductor having appropriate film thickness is obtained in a short operating time.

A controller according to an embodiment of the present invention controls a robot used to bond a radiation plate to an electric component via a heat conductor. The controller includes a machine learning device that learns an operating parameter for an operation of bonding the radiation plate by the robot. The machine learning device includes a state observation section that observes, as state variables that express a current state of an environment, operating parameter data indicating the operating parameter, and heat conductor state data indicating a state of the heat conductor, a determination data acquisition section that acquires determination data indicating a propriety determination result of the operation of bonding the radiation plate, and a learning section that learns the operating parameter in association with the heat conductor state data, using the state variables and the determination data.

The state observation section may further observe, as the state variable, at least any of electric component type information for identifying a type of the electric component and substrate type information for identifying a type of a substrate onto which the electric component is attached, and the learning section may learn the operating parameter in association with any of the electric component type information and the substrate type information, besides the heat conductor state data.

The learning section may include a reward calculation section that calculates a reward relating to the propriety determination result, and a value function update section that updates, using the reward, a function that expresses a value of the operating parameter with respect to the state of the heat conductor.

The learning section may calculate the state variables and the determination data in a multilayer structure.

The controller may further include a decision-making section that outputs a command value based on the operating parameter, according to a learning result of the learning section.

The learning section may learn the operating parameter in each of a plurality of robots, using the state variables and the determination data obtained for each of the plurality of robots.

The machine learning device may exist in one of a cloud server and a cell controller.

A machine learning device according to another embodiment of the present invention learns an operating parameter for an operation of bonding a radiation plate by a robot used to bond the radiation plate to an electric component via a heat conductor. The machine learning device includes: a state observation section that observes, as state variables that express a current state of an environment, operating parameter data indicating the operating parameter, and heat conductor state data indicating a state of the heat conductor; a determination data acquisition section that acquires determination data indicating a propriety determination result of the operation of bonding the radiation plate; and a learning section that learns the operating parameter in association with the heat conductor state data, using the state variables and the determination data.

According to an embodiment of the present invention, it is possible to shorten tact time for automatic bonding while maintaining appropriate film thickness without relying on manpower and without being influenced by the state of a heat conductor or an environment.

DETAILED DESCRIPTION OF THE PREFERRED EMBODIMENTS

Figure 1:
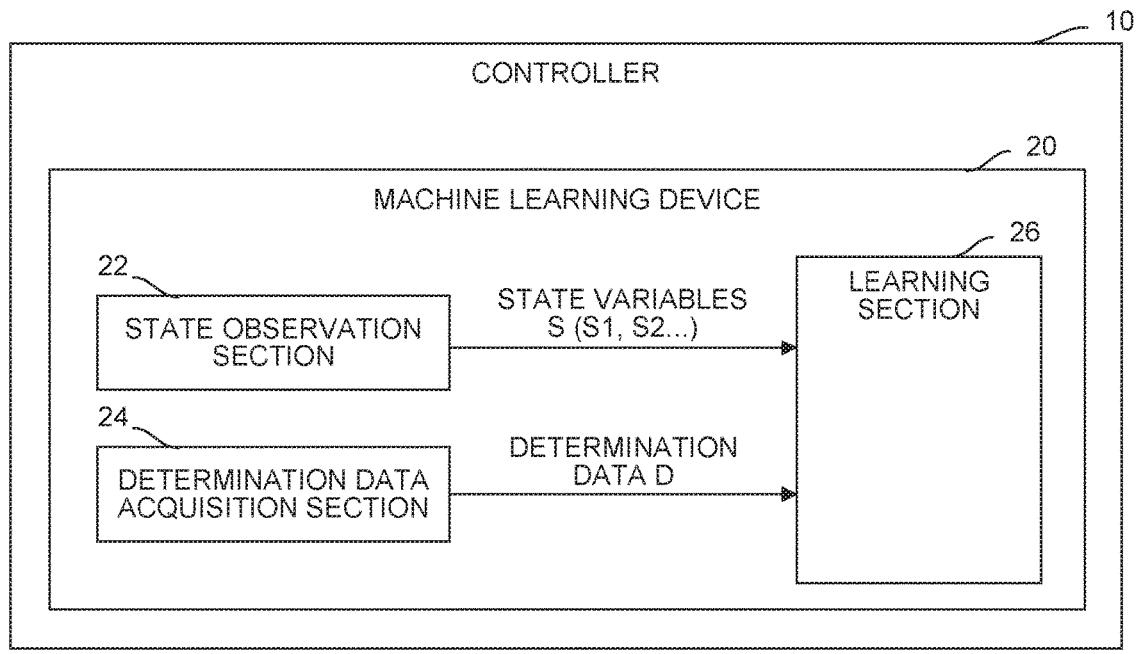
FIG. 1 is a schematic function block diagram of a controller according to a first embodiment of the present invention.

FIG. 1 is a schematic function block diagram of a controller 10 according to a first embodiment.

The controller 10 may be mounted as, for example, a controller that controls a robot (not shown) for bonding a radiation plate to an electric component attached onto a substrate. The controller 10 includes a machine learning device 20 having software (such as a learning algorithm) and hardware (such as the CPU of a computer) for spontaneously learning operating parameters (such as a command position, arm speed, pressing pressure, and pressing time) for the operation of bonding a radiation plate by a robot through so-called machine learning. Operating parameters learned by the machine learning device 20 of the controller 10 correspond to a model structure that expresses the correlation between the state of a heat conductor used in the bonding of a radiation plate and operating parameters for the operation of bonding the radiation plate by a robot in the state.

As shown in the function block of FIG. 1, the machine learning device 20 of the controller 10 includes a state observation section 22, a determination data acquisition section 24, and a learning section 26. The state observation section 22 observes state variables S expressing the current state of an environment, which include operating parameter data S1 indicating operating parameters set with respect to the state of a heat conductor used in the bonding of a radiation plate and heat conductor state data S2 indicating the state of the heat conductor used in the bonding of the radiation plate. The determination data acquisition section 24 acquires determination data D indicating a propriety determination result of the operation of bonding a radiation plate by a robot under set operating parameters. Using the state variables S and the determination data D, the learning section 26 learns the operating parameter data S1 and the heat conductor state data S2 in association with each other.

The state observation section 22 may be configured as, for example, one of the functions of the CPU of a computer or software for functioning the CPU of the computer. Among the state variables S observed by the state observation section 22, the operating parameter data S1 may be acquired from, for example, report data on operating parameters reported by a skilled worker and given to the controller 10, log data on the operation of bonding a radiation plate by a robot acquired from the robot or the controller of the robot, or the like. As the operating parameter data S1, a command position indicating a position at which the operation of bonding a radiation plate starts, arm speed in the bonding operation, pressing pressure and pressing time of the radiation plate with respect to an electric component in the bonding operation, or the like may be, for example, used.

In addition, as the heat conductor state data S2 among the state variables S, values actually measured by various sensors (not shown) such as a temperature sensor and a humidity sensor attached to a robot, setting values acquired from various robots used in a system that mounts an electric component or the like on a substrate or the controllers of the robots, or the like may be, for example, used. As the heat conductor state data S2, a coating amount of a heat conductor (acquired from a setting value of an adhesive apparatus that coats the heat conductor on a radiation plate, or the like), a type of the heat conductor (acquired from a setting value of the adhesive apparatus that coats the heat conductor on the radiation plate, or the like), temperature (acquired from a temperature sensor) or humidity (acquired from a humidity sensor) of an environment in which an electric component or the like is mounted on a substrate, or the like may be, for example, used.

The determination data acquisition section 24 may be configured as, for example, one of the functions of the CPU of a computer or software for functioning the CPU of the computer. As the determination data D acquired by the determination data acquisition section 24, a value actually measured by a first measurement device (not shown) attached to a robot after the operation of bonding a radiation plate is performed by the robot, a value acquired from a robot or a controller that controls the robot, or the like may be, for example, used. As the determination data D, the thickness of a heat conductor between a bonded radiation plate and an electric component, tact time for a bonding operation by a robot, or the like may be, for example, used. The determination data D is an index that expresses a result obtained when the operation of bonding a radiation plate by a robot is performed under the state variables S, and indirectly expresses the state of the bonding operation.

The first measurement device is a measurement device used to measure the thickness of a heat conductor between a bonded radiation plate and an electric component. The first measurement device measures, for example, the height of the upper end of a radiation plate positioned on an electric component from a reference position. In this case, the height of the radiation plate without the heat conductor placed on the electric component is measured and stored in advance as a reference value, and the reference value is subtracted from a value measured by the first measurement device after a bonding operation by a robot. Thus, the thickness of the heat conductor between the bonded radiation plate and the electric component may be measured. The calculation may be performed by, for example, the controller 10 or the state observation section 22 itself. The first measurement device may be fixed at any position of a system that mounts an electric component, or may be attached to the arm of a robot. As the first measurement device, an optical imaging device, an infrared laser, an ultrasonic measurement device, or the like may be employed.

As described above, while the machine learning device 20 of the controller 10 advances machine learning, the acquisition of the heat conductor state data S2 from a sensor or the like, the operation of bonding a radiation plate by a robot, and the acquisition of the determination data D from the first measurement device or the like are performed in an environment.

The learning section 26 may be configured as, for example, one of the functions of the CPU of a computer or software for functioning the CPU of the computer. According to any learning algorithm collectively called machine learning, the learning section 26 learns operating parameters for the operation of bonding a radiation plate by a robot. The learning section 26 may repeatedly perform learning based on a data set including the above state variables S and the determination data D with respect to the operation of bonding a plurality of radiation plates by a robot. When a learning cycle is repeatedly performed with respect to the operation of bonding a plurality of radiation plates by a robot, it is assumed that the operating parameter data S1 among the state variables S indicates operating parameters obtained until the previous learning cycle, and that the determination data D indicates a propriety determination result with respect to the operation of bonding the radiation plates by the robot based on the determined operating parameters.

By repeatedly performing such a learning cycle, the learning section 26 may automatically identify a feature suggesting the correlation between the state of a heat conductor (heat conductor state data S2) and operating parameters for the operation of bonding a heating plate by a robot. Although the correlation between the heat conductor state data S2 and the operating parameters is substantially unknown at the start of a learning algorithm, the learning section 26 gradually identifies a feature indicating the correlation and interprets the correlation as learning is advanced. When the correlation between the heat conductor state data S2 and operating parameters is interpreted to a certain reliable extent, learning results repeatedly output by the learning section 26 may be used to select the action (that is, decision making) of determining under what operating parameters the operation of accommodating a radiation plate is performed with respect to a current state (that is, the state of a heat conductor). That is, as a learning algorithm is advanced, the learning section 26 may gradually approximate the correlation between the state of a heat conductor and the action of determining under what operating parameters the operation of bonding a radiation plate is performed with respect to the state to an optimum solution.

As described above, in the machine learning device 20 of the controller 10, the learning section 26 learns operating parameters for bonding a radiation plate to an electric component by a robot according to a machine learning algorithm using the state variables S observed by the state observation section 22 and the determination data D acquired by the determination data acquisition section 24. The state variables S are composed of the operating parameter data S1 and the heat conductor state data S2 hardly influenced by disturbance. In addition, the determination data D is uniquely calculated by the acquisition of tact time for the operation of bonding a heating plate by a robot or the film thickness of a heat conductor between a radiation plate and an electric component after the bonding operation. The heat conductor state data S2 depends on, for example, the measurement accuracy of each part of a machine as the performance of a temperature sensor or a humidity sensor, but the observation of the heat conductor state data S2 that is of high accuracy itself is expected. In addition, the determination data D depends on the measurement accuracy of the first measurement device, and the acquisition of the determination data D that is of high accuracy is expected. Accordingly, using learning results of the learning section 26, the machine learning device 20 of the controller 10 may automatically and accurately calculate operating parameters for the operation of bonding a radiation plate by a robot according to the state of a heat conductor without relying on calculation or estimation.

If it is possible to automatically calculate operating parameters for the operation of bonding a radiation plate by a robot without relying on calculation or estimation, appropriate operating parameters for bonding the radiation plate by the robot may be quickly determined only by understanding the state of a heat conductor (heat conductor state data S2) before the operation of bonding the radiation plate by the robot starts. Accordingly, the operation of bonding a radiation plate by a robot may be efficiently performed.

As a modified example of the machine learning device 20 of the controller 10, the state observation section 22 may further observe, as the state variables S, electric component type information S3 and substrate type information S4 besides the operating parameter data S1 and the heat conductor state data S2. The electric component type information S3 may include, for example, a shape, strength, or the like of an electric component. In addition, the substrate type information S4 may include strength or the like of a substrate. The state observation section 22 may acquire the electric component type information S3 and the substrate type information S4 from, for example, information on an electric component and a substrate set in advance in the controller 10. In this case, operating parameters may be learned in association with at least any of the electric component type information S3 and the substrate type information S4 besides the heat conductor state data S2.

According to the above modified example, the machine learning device 20 may learn operating parameters for a case in which the operation of bonding a radiation plate by a robot is performed on an electric component attached onto a specific type of a substrate or performed on a specific type of an electric component. For example, when strengths, shapes, or the like of two types of electric components to be bonded (electric component type information S3) are different from each other even if the state of a heat conductor (heat conductor state data S2) is substantially the same, there could be a situation in which operating parameters for the operation of bonding a radiation plate to the electric components become slightly different. However, even under such a situation, the above configuration makes it possible to optimize operating parameters for the operation of bonding a radiation plate according to strengths, shapes, or the like of electric components (electric component type information S3). Alternatively, there could be a case in which the correlation between the state of a heat conductor (heat conductor state data S2) and a type of an electric component (electric component type information S3) or a type of a substrate (substrate type information S4) may be found out as learning is advanced. In this case, since the heat conductor state data S2 may be predicted from the electric component type information S3 or the substrate type information S4 to some extent, operating parameters for appropriately completing learning and accommodating an article may be optimized even in a case in which the measurement accuracy of the state of a heat conductor is low.

As another modified example of the machine learning device 20 of the controller 10, the learning section 26 may learn operating parameters for the operation of bonding a radiation plate by robots using the state variables S and the determination data D acquired for each of the plurality of robots having the same configuration. According to the configuration, it possible to increase an amount of a data set including the state variables S and the determination data D acquired in a certain period of time. Therefore, the learning speed and the reliability of operating parameters for the operation of bonding a radiation plate by a robot may be improved with a set of more various data set as inputs.

Figure 2:
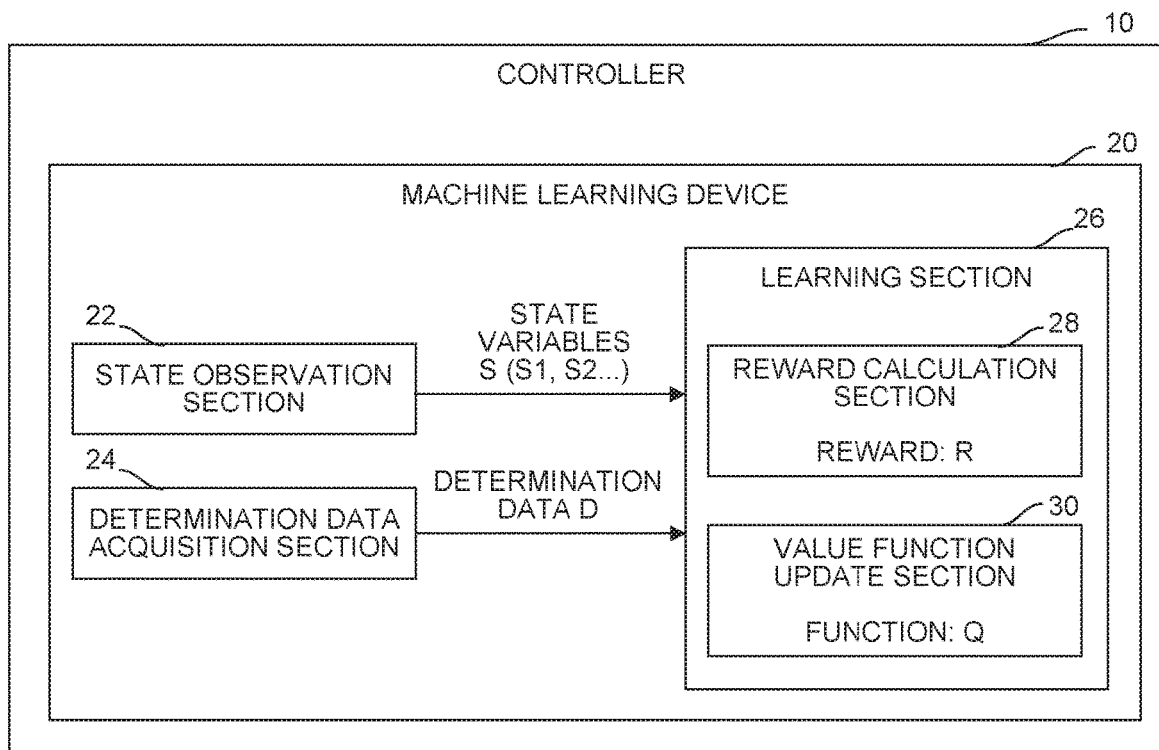
FIG. 2 is a schematic function block diagram showing an embodiment of the controller.

In the machine learning device 20 having the above configuration, a learning algorithm performed by the learning section 26 is not particularly limited, and a learning algorithm known as machine learning may be employed. FIG. 2 shows, as an embodiment of the controller 10 shown in FIG. 1, a configuration including the learning section 26 that performs reinforcement learning as an example of a learning algorithm.

In the reinforcement learning, a cycle of observing the current state (that is, an input) of an environment in which a learning1 target exists and performing a prescribed action (that is, an output) in the current state and giving any reward to the action is repeatedly performed by trial and error to learn measures (operating parameters for the operation of bonding a radiation plate by a robot in the machine learning device of the present application) to maximize the total of the rewards as an optimum solution.

In the machine learning device 20 of the controller 10 shown in FIG. 2, the learning section 26 includes a reward calculation section 28 that calculates a reward R relating to a propriety determination result (corresponding to the determination data D used in the next learning cycle) of the operation of bonding a radiation plate by a robot based on the state variables S, and includes a value function update section 30 that updates, using the calculated rewards R, a function Q that expresses values of operating parameters for the operation of bonding the radiation plate by the robot. The learning section 26 learns operating parameters for the operation of bonding a radiation plate by a robot with respect to the state of a heat conductor in such a way that the value function update section 30 repeatedly updates the function Q.

An example of a reinforcement learning algorithm performed by the learning section 26 will be described. The algorithm in this example is known as Q-learning and expresses a method in which a state s of an action subject and an action a possibly taken by the action subject in the state s are assumed as independent variables and a function Q(s, a) that expresses an action value when the action a is selected in the state s is learned. The selection of the action a by which the value function Q becomes maximum in the state s results in an optimum solution. By starting the Q-learning in a state in which the correlation between the state s and the action a is unknown and repeatedly performing the selection of various actions a by trial and error in any state s, the value function Q is repeatedly updated to be approximated to an optimum solution. Here, when an environment (that is, the state s) changes as the action a is selected in the state s, a reward (that is, weighting of the action a) r is obtained according to the change and the learning is directed to select an action a by which a higher reward r is obtained. Thus, the value function Q may be approximated to an optimum solution in a relatively short period of time.

Generally, the update formula of the value function Q may be expressed like the following formula (1). In formula (1), $s_t$ and $a_t$ express a state and an action at time t, respectively, and the state changes to $s_{t+1}$ with the action $a_t$. $r_{t+1}$ expresses a reward obtained when the state changes from $s_t$ to $s_{t+1}$. The term of max Q expresses Q in a case in which an action a by which the value function Q becomes maximum at time t+1 (which is assumed at time t) is performed. $\alpha$ and $\gamma$ express a learning coefficient and a discount rate, respectively, and arbitrarily set to fall within $0<\alpha \leq 1$ and $0<\gamma \leq 1$, respectively.

$$Q(s_t, a_t) \leftarrow Q(s_t, a_t) + \alpha\left(r_{t+1} + \gamma \max_a Q(s_{t+1}, a) - Q(s_t, a_t)\right)$$

When the learning section 26 performs the Q-learning, the state variables S observed by the state observation section 22 and the determination data D acquired by the determination data acquisition section 24 correspond to the state s in the update formula (formula (1) above), the action of changing operating parameters for the operation of bonding a radiation plate by a robot with respect to a current state (that is, the state of a heat conductor) corresponds to the action a in the update formula, and the rewards R calculated by the reward calculation section 28 correspond to the reward r in the update formula. Accordingly, the value function update section 30 repeatedly updates the function Q that expresses values of operating parameters for the operation of bonding a radiation plate by a robot in a current state by the Q-learning using the rewards R.

Regarding the rewards R calculated by the reward calculation section 28, for example, when the operation of bonding the radiation plate by a robot is performed based on operating parameters after the determination of the operating parameters for the operation of bonding the radiation plate by the robot, (i) if the state of the operation of bonding a radiation plate is determined to be "appropriate" (for example, a case in which tact time falls within an allowable range, a case in which the film thickness of a heat conductor between the radiation plate and an electric component falls within an allowable range, or the like), then the rewards R may be positive, (ii) on the other hand, if the state of the operation of bonding a radiation plate is determined to be "inappropriate" (for example, a case in which tact time goes beyond an allowable range, a case in which the film thickness of a heat conductor between the radiation plate and an electric component goes beyond an allowable range, or the like), then the rewards may be negative.

The absolute values of the positive and negative rewards R may be the same or different from each other. In addition, as determination conditions, a plurality of values included in the determination data D may be combined together to perform a determination.

In addition, a propriety determination result of the state of the operation of bonding a radiation plate by a robot may include not only two levels of "appropriate" and "inappropriate" results but also a plurality of levels of results. As an example, when a maximum value within an allowable range as time for the operation of bonding a radiation plate is assumed as $T_{max}$, the reward R=5 is given if time T of the operation of bonding the radiation plate falls within $0 \le T < T_{max}/5$, the reward R=2 is given if the time T of the operation of bonding the radiation plate falls within $T_{max}/5 \le T < T_{max}/2$, and the reward R=1 is given if the time T of the operation of bonding the radiation plate falls within $T_{max}/2 \le T \le T_{max}$. In addition, $T_{max}$ may be set to be relatively larger at the initial stage of the learning and set to decrease as the learning is advanced.

The value function update section 30 may have an action value table in which the state variables S, the determination data D, and the rewards R are organized in association with action values (for example, numeric values) expressed by the function Q. In this case, the action of updating the function Q with the value function update section 30 is equivalent to the action of updating the action value table with the value function update section 30. At the start of the Q-learning, the correlation between the current state of an environment and operating parameters for the operation of bonding a radiation plate by a robot is unknown. Therefore, in the action value table, various kinds of the state variables S, the determination data D, and the rewards R are prepared in association with values (function Q) of randomly-set action values. Note that the reward calculation section 28 may immediately calculate the rewards R corresponding to the determination data D when the determination data D is known, and values of the calculated rewards R are written in the action value table.

When the Q-learning is advanced using the reward R corresponding to a propriety determination result of the state of the operation of bonding a radiation plate by a robot, the learning is directed to select the action of obtaining a higher reward R. Then, values (function Q) of action values for an action performed in a current state are rewritten to update the action value table according to the state of an environment (that is, the state variables S and the determination data D) that changes as the selected action is performed in the current state. By repeatedly performing the update, values (function Q) of action values displayed in the action value table are rewritten to be larger as an action is more appropriate. Thus, the correlation between a current state (the state of a heat conductor) in an unknown environment and a corresponding action (operating parameters for the operation of bonding a radiation plate by a robot) becomes gradually obvious. That is, by the update of the action value table, the relationship between the state of a heat conductor and operating parameters for the operation of bonding a radiation plate by a robot is gradually approximated to an optimum solution.

Figure 3:
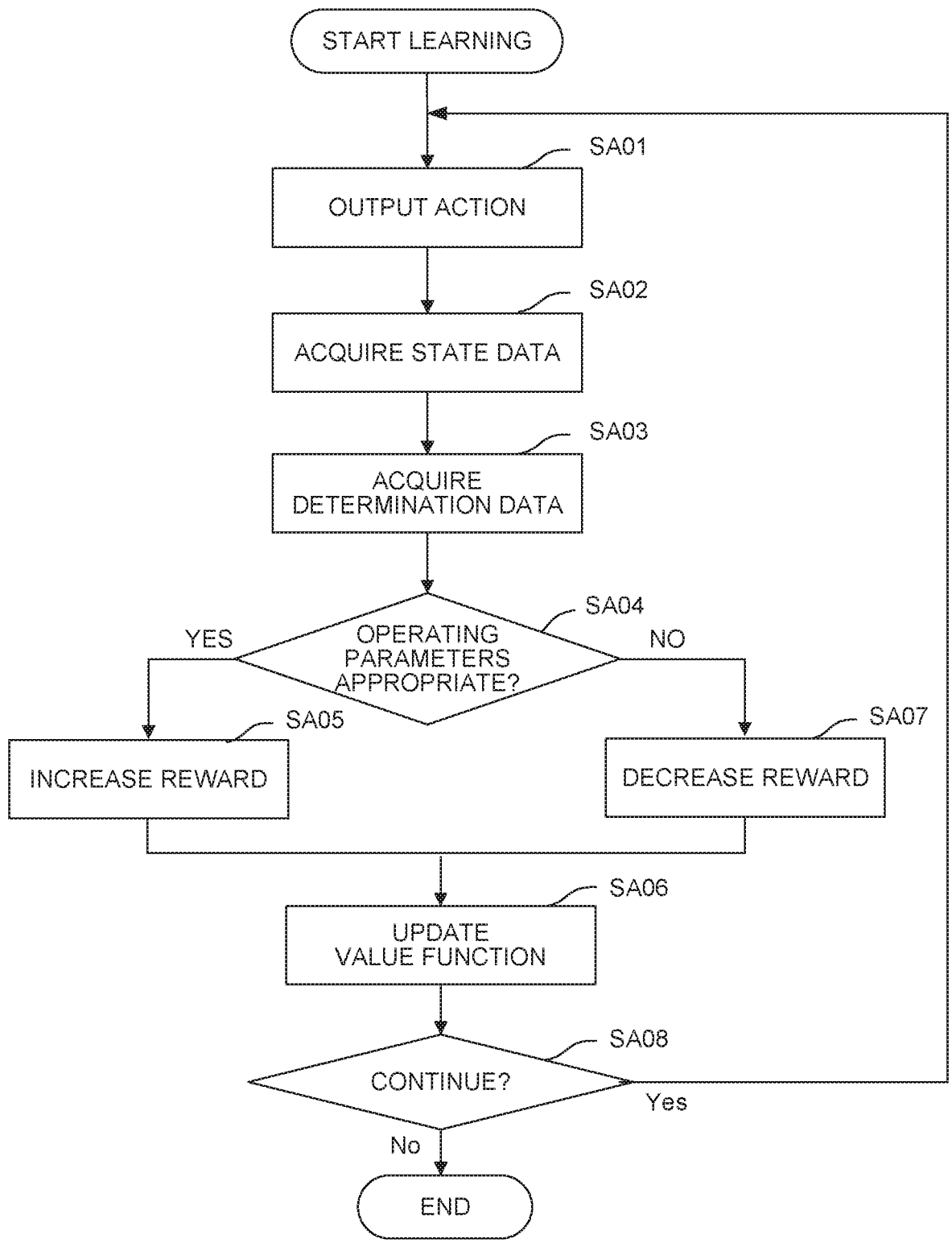
FIG. 3 is a schematic flowchart showing an embodiment of a machine learning method.

The flow of the above Q-learning (that is, an embodiment of a machine learning method) performed by the learning section 26 will be further described with reference to FIG. 3.

First, in step SA01, the value function update section 30 randomly selects, by referring to an action value table at that time, operating parameters for the operation of bonding a radiation plate by a robot as an action performed in a current state indicated by the state variables S observed by the state observation section 22. Next, the value function update section 30 imports the state variable S in the current state observed by the state observation section 22 in step SA02, and imports the determination data D in the current state acquired by the determination data acquisition section 24 in step SA03. Then, in step SA04, the value function update section 30 determines if the operating parameters for the operation of bonding the radiation plate by the robot are appropriate based on the determination data D. If the operating parameters are appropriate, the value function update section 30 applies a positive reward R calculated by the reward calculation section 28 to the update formula of the function Q in step SA05. Next, in step SA06, the value function update section 30 updates the action value table using the state variable S and the determination data D in the current state, the reward R, and a value (updated function Q) of an action value. If it is determined in step SA04 that the operating parameters for the operation of bonding the radiation plate by the robot are inappropriate, the value function update section 30 applies a negative reward R calculated by the reward calculation section 28 to the update formula of the function Q in step SA07. Then, in step SA06, the value function update section 30 updates the action value table using the state variable S and the determination data D in the current state, the reward R, and the value (updated function Q) of the action value.

The learning section 26 updates the action value table over again by repeatedly performing the processing of steps SA01 to SA07 and advances the learning of the operating parameters for the operation of bonding the radiation plate by the robot.

Figure 4A:
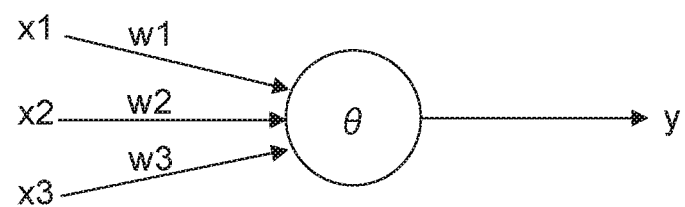
FIG. 4A is a diagram for describing a neuron.
Figure 4B:
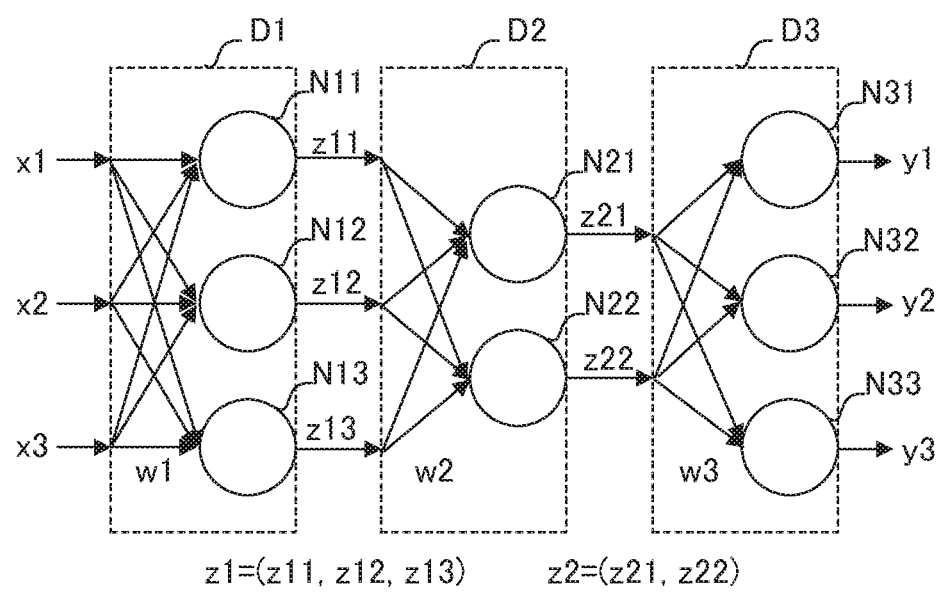
FIG. 4B is a diagram for describing a neural network.

In advancing the above reinforcement learning, a neural network may be used, for example, instead of the Q-learning. FIG. 4A schematically shows a neuron model. FIG. 4B schematically shows the model of a neural network having three layers in which the neurons shown in FIG. 4A are combined together. The neural network may be configured by, for example, a calculation unit, a storage unit, or the like following a neuron model.

The neuron shown in FIG. 4A outputs a result y with respect to a plurality of inputs x (here, inputs $x_1$ to $x_3$ as an example). The inputs $x_1$ to $x_3$ are multiplied by corresponding weights w ($w_1$ to $w_3$), respectively. Thus, the neuron outputs the result y expressed by the following formula (2). Note that in the following formula (2), an input x, a result y, and a weight w are all vectors. In addition, θ expresses a bias, and $f_k$ expresses an activation function.

$$y=f_k(\Sigma_{i=1}^n x_i w_i - \theta) \qquad (2)$$

In the neural network having the three layers shown in FIG. 4B, a plurality of inputs x (here, inputs x1 to x3 as an example) is input from the left side of the neural network, and results y (here, results y1 to y3 as an example) are output from the right side of the neural network. In the example shown in FIG. 4B, the inputs x1 to x3 are multiplied by corresponding weights (collectively expressed as w1) and input to three neurons N11 to N13, respectively.

In FIG. 4B, the respective outputs of the neurons N11 to N13 are collectively expressed as z1. The outputs z1 may be regarded as feature vectors obtained by extracting feature amounts of the input vectors. In the example shown in FIG. 4B, the respective feature vectors z1 are multiplied by corresponding weights (collectively indicated as w2) and input to two neurons N21 and N22, respectively. The feature vectors z1 express the features between the weights w1 and the weights w2.

In FIG. 4B, the respective outputs of neurons N21 and N22 are collectively expressed as z2. The outputs z2 may be regarded as feature vectors obtained by extracting feature amounts of the feature vectors z1. In the example shown in FIG. 4B, the respective feature vectors z2 are multiplied by corresponding weights (collectively indicated as w3) and input to three neurons N31 to N33, respectively. The feature vectors z2 express the features between the weights w2 and the weight w3. Finally, the neurons N31 to N33 output the results y1 to y3, respectively.

Note that it is possible to employ so-called deep learning in which a neural network forming three or more layers is used.

In the machine learning device 20 of the controller 10, the learning section 26 calculates the state variables S and the determination data D as inputs x in a multilayer structure according to the above neural network to be capable of outputting operating parameters for the operation of bonding a radiation plate by a robot (result y). Note that the operation mode of the neural network includes a learning mode and a value prediction mode. For example, it is possible to learn a weight W using a learning data set in the learning mode and determine an action value using the learned weight W in the value prediction mode. Note that detection, classification, deduction, or the like may be performed in the value prediction mode.

The configuration of the above controller 10 may be described as a machine learning method (or software) performed by the CPU of a computer. The machine learning method is a machine learning method for learning operating parameters for the operation of bonding a radiation plate by a robot. The CPU of a computer performs: a step of observing operating parameter data S1 indicating operating parameters for the operation of bonding a radiation plate by a robot and heat conductor state data S2 indicating the state of a heat conductor as state variables S that express the current state of an environment in which the operation of bonding the radiation plate by the robot is performed; a step of acquiring determination data D indicating a propriety determination result of the state of the operation of bonding the radiation plate by the robot; and a step of learning operating parameter for the operation of bonding the radiation plate by the robot and the heat conductor state data S2 in association with each other using the state variables S and the determination data D.

Figure 5:
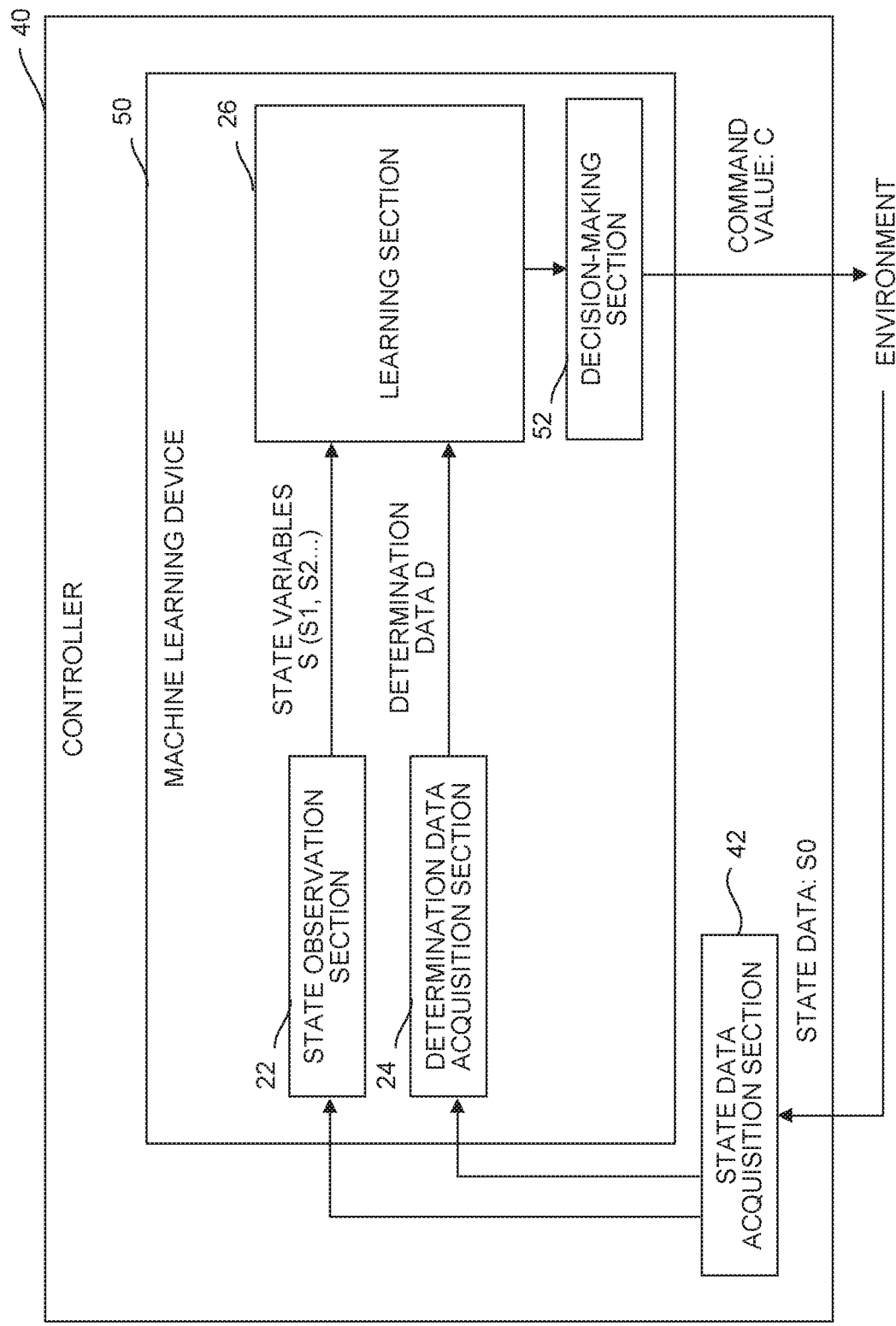
FIG. 5 is a schematic function block diagram of a controller according to a second embodiment of the present invention.

FIG. 5 shows a controller 40 according to a second embodiment.

The controller 40 includes a machine learning device 50 and a state data acquisition section 42. The state data acquisition section 42 acquires operating parameter data S1 and heat conductor state data S2 of state variables S observed by a state observation section 22 as state data S0. The state data S0 acquired by the state data acquisition section 42 may also include electric component type information S3 and substrate type information S4. The state data acquisition section 42 may acquire the state data S0 from various sensors attached to the apparatus, the first measurement device described above, setting values of respective devices, appropriate data inputs by a worker, or the like.

The machine learning device 50 of the controller 40 includes, besides software (such as a learning algorithm) and hardware (such as the CPU of a computer) for spontaneously learning operating parameters for the operation of bonding a radiation plate by a robot through machine learning, software (such as a calculation algorithm) and hardware (such as the CPU of a computer) for outputting the learned operating parameters for the operation of bonding the radiation plate by the robot as a command for the robot (not shown). The machine learning device 50 of the controller 40 may be so configured that one common CPU performs all software such as a learning algorithm and a calculation algorithm.

A decision-making section 52 may be configured as, for example, one of the functions of the CPU of a computer or software for functioning the CPU of the computer. The decision-making section 52 generates and outputs a command value C for a robot that performs the operation of bonding a radiation plate based on operating parameters for the operation of bonding the radiation plate by the robot learned by the learning section 26. When the decision-making section 52 outputs to the robot the command value C based on the operating parameters for the operation of bonding the radiation plate by the robot, the state (operating parameter data S1) of an environment changes correspondingly.

The state observation section 22 observes, in a next learning cycle, state variables S including operating parameter data S1 changed after the display or the output of the operating parameters for the operation of bonding the radiation plate by the robot to an environment by the decision-making section 52. The learning section 26 updates, for example, a value function Q (that is, an action value table) using the changed state variables S to learn the operating parameters for the operation of bonding the radiation plate by the robot. Based on the learned operating parameters for the operation of bonding the radiation plate by the robot, the decision-making section 52 outputs to the robot the command value C based on the operating parameters for the operation of bonding the radiation plate by the robot according to the state variables S. By repeatedly performing the cycle, the machine learning device 50 advances the learning of the operating parameters for the operation of bonding the radiation plate by the robot and gradually improves the reliability of the operating parameters for the operation of bonding the radiation plate by the robot determined by the machine learning device 50 itself.

The machine learning device 50 of the controller 40 having the above configuration produces the same effect as that of the above machine learning device 20 shown in FIGS. 1 and 2. Particularly, the machine learning device 50 shown in FIG. 5 may change the state of an environment with the output of the decision-making section 52. On the other hand, the machine learning device 20 may ask a function corresponding to a decision-making section for reflecting learning results of the learning section 26 on an environment for an external apparatus (for example, the controller of a robot).

Figure 6:
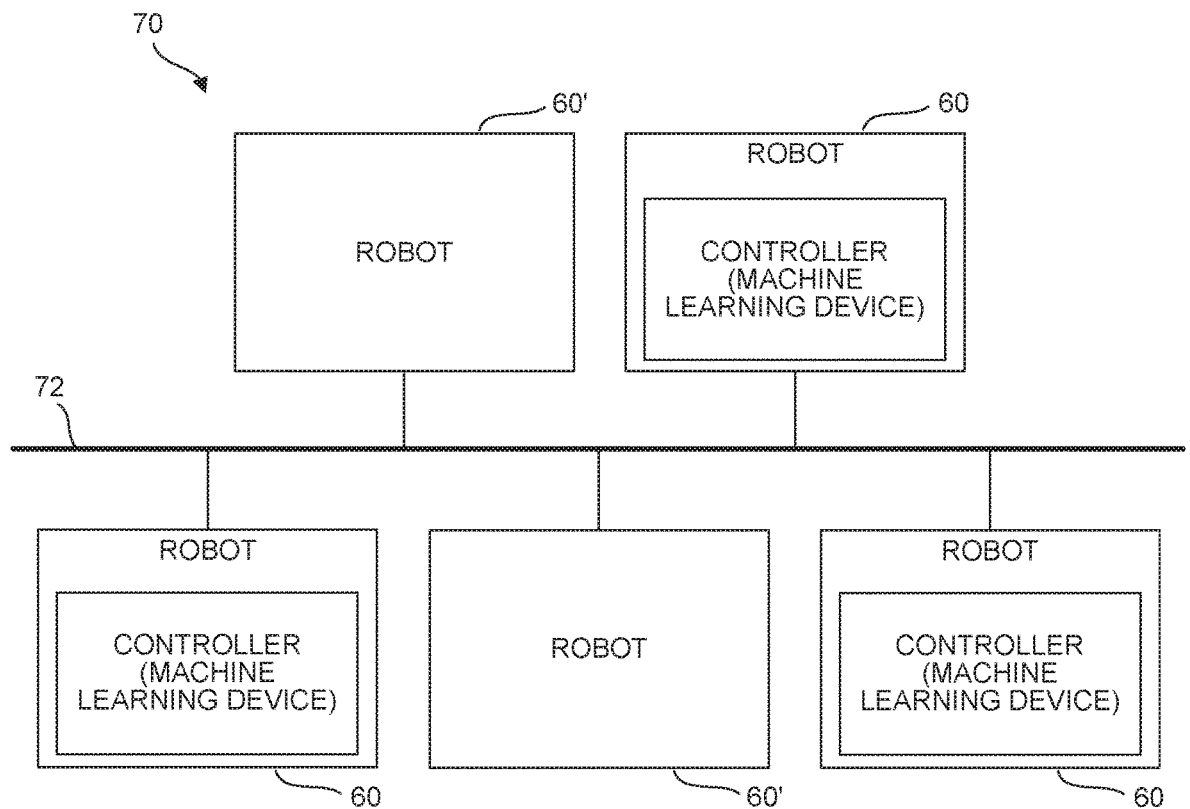
FIG. 6 is a schematic function block diagram showing an embodiment of a component mounting system.

FIG. 6 shows a component mounting system 70 including robots 60 according to an embodiment.

The component mounting system 70 includes a plurality of robots 60 and 60' having at least the same machine configuration and a network 72 that connects the robots 60 and 60' to each other. At least one of the plurality of robots 60 and 60' is configured as a robot 60 including the above controller 40. In addition, the component mounting system 70 may have robots 60' that do not include the controller 40. The robots 60 and 60' have a general configuration for bonding a radiation plate to an electronic component attached onto a substrate.

In the component mounting system 70 having the above configuration, the robots 60 including the controller 40 among the plurality of robots 60 and 60' may automatically and accurately calculate operating parameters for the operation of bonding a radiation plate by the robots 60 and 60' according to the state of a heat conductor without relying on calculation or estimation using learning results of the learning section 26. In addition, the controller 40 of at least one of the robots 60 may learn operating parameters for the operation of bonding a radiation plate by robots common to all the robots 60 and 60' based on state variables S and determination data D obtained for each of the other plurality of robots 60 and 60' so that the learning results are shared between all the robots 60 and 60'. Accordingly, the component mounting system 70 makes it possible to improve the speed and the reliability of learning operating parameters for the operation of bonding a radiation plate by a robot with a broader range of data sets (including state variables S and determination data D) as inputs.

Figure 7:
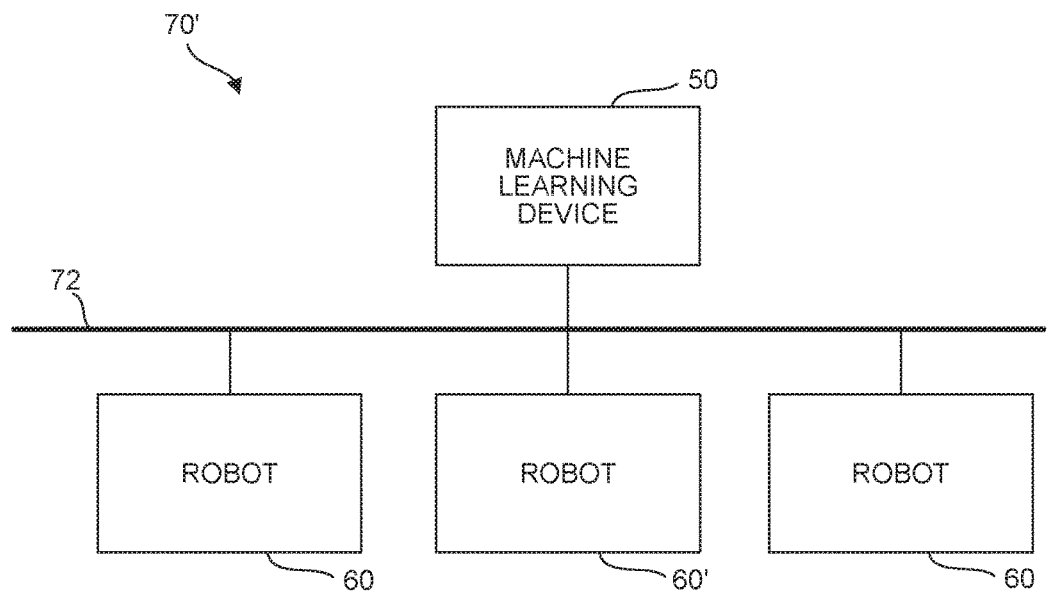
FIG. 7 is a schematic function block diagram showing another embodiment of a component mounting system.
Figure 8C:
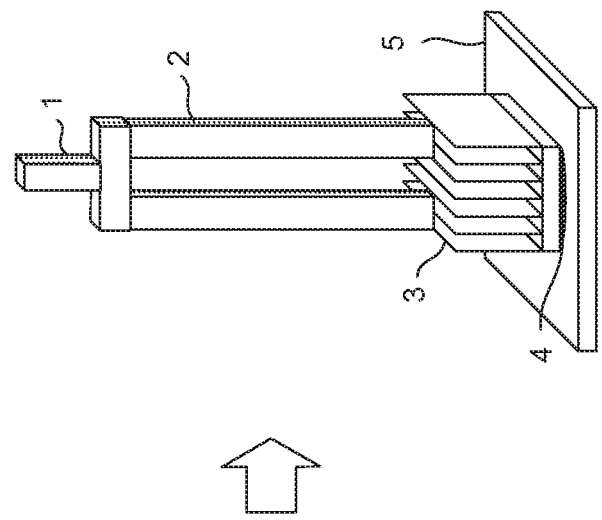
FIGS. 8A to 8C are diagrams for describing the operation of bonding a radiation plate to an electric component by a robot according to a related art.
Figure 8B:
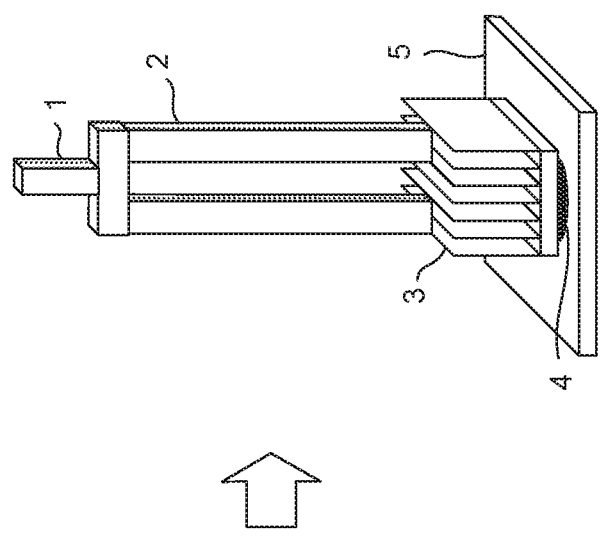
Figure 8A:
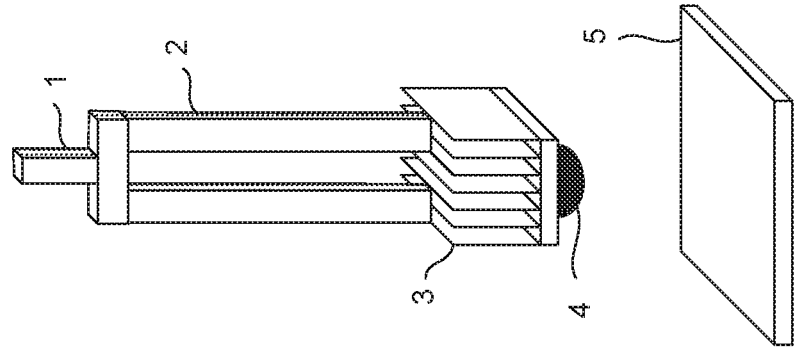

FIG. 7 shows a component mounting system 70' including robots 60' according to another embodiment.

The component mounting system 70' includes the machine learning device 50 (or 20), a plurality of robots 60' having the same machine configuration, and a network 72 that connects the robot 60' and the machine learning device 50 (or 20) to each other.

In the component mounting system 70' having the above configuration, the machine learning device 50 (or 20) may learn operating parameters for the operation of bonding a radiation plate by robots common to all the robots 60' based on state variables S and determination data D obtained for each of the plurality of robots 60', and automatically and accurately calculate the operating parameters for the operation of bonding the radiation plate by the robots according to the state of a heat conductor, without relying on calculation or estimation, using the learning results.

In the component mounting system 70', the machine learning device 50 (or 20) may have a configuration existing in a cloud server, a cell controller, or the like provided in the network 72. According to the configuration, a desired number of the robots 60' may be connected to the machine learning device 50 (or 20) where necessary regardless of the existing locations and the times of the plurality of robots 60'.

Workers engaging in the component mounting systems 70 and 70' may perform a determination as to whether an achievement degree of learning operating parameters for the operation of bonding a radiation plate by a robot (that is, the reliability of the operating parameters for the operation of bonding the radiation plate by the robot) with the machine learning device 50 (or 20) has reached a required level at an appropriate timing after the start of learning by the machine learning device 50 (or 20).

The embodiments of the present invention are described above. However, the present invention is not limited to the examples of the above embodiments and may be carried out in various modes with the addition of appropriate modifications.

For example, a learning algorithm performed by the machine learning devices 20 and 50, a calculation algorithm performed by the machine learning device 50, and a control algorithm performed by the controllers 10 and 40 are not limited to the above algorithms, but various algorithms may be employed.

In addition, the above embodiments describe an example in which the machine learning devices 20 and 50 perform machine learning online on the controllers 10 and 40. However, the machine learning devices 20 and 50 may record the state data S and the determination data D as log data in advance during the control of a robot by the controllers 10 and 40, collect the recorded log data, and perform machine learning based on the state data S and the determination data D acquired from the collected log data.

The invention claimed is:

1. A controller configured to control a robot used to bond a radiation plate to an electric component via a heat conductor, the controller comprising:
   a machine learning device configured to learn an operating parameter for an operation of bonding the radiation plate by the robot, wherein
   the machine learning device includes a processor configured to
      observe, as state variables that express a current state of an environment, operating parameter data indicating the operating parameter, and heat conductor state data indicating a state of the heat conductor,
      acquire determination data indicating a propriety determination result of the operation of bonding the radiation plate,
      learn the operating parameter in association with the heat conductor state data, using the state variables and the determination data, and
      output a command value based on the operating parameter, according to a learning result, to control the robot to bond the radiation plate to the electric component via the heat conductor based on the command value.

2. The controller according to claim 1, wherein
   the processor is configured to
      observe, as the state variable, at least any of electric component type information for identifying a type of the electric component and substrate type information for identifying a type of a substrate onto which the electric component is attached, and
      learn the operating parameter in association with any of the electric component type information and the substrate type information, besides the heat conductor state data.

3. The controller according to claim 1, wherein
   the processor is configured to
      calculate a reward relating to the propriety determination result, and
      update, using the reward, a function that expresses a value of the operating parameter with respect to the state of the heat conductor.

4. The controller according to claim 1, wherein
the processor is configured to calculate the state variables and the determination data in a multilayer structure.
5. The controller according to claim 1, wherein
the processor is configured to learn the operating parameter in each of a plurality of robots, using the state variables and the determination data obtained for each of the plurality of robots.
6. The controller according to claim 1, wherein
the machine learning device exists in one of a cloud server and a cell controller.

* * * * *